United States Patent [19]
Duffalo et al.

[11] Patent Number: 4,890,069
[45] Date of Patent: Dec. 26, 1989

[54] GALLIUM ARSENIDE POWER MONOLITHIC MICROWAVE INTEGRATED CIRCUIT

[75] Inventors: Joseph M. Duffalo, Mesa, Ariz.; Steven C. Lazar, Jr., Plano, Tex.

[73] Assignee: Motorola Inc., Schaumburg, Ill.

[21] Appl. No.: 161,650

[22] Filed: Feb. 29, 1988

[51] Int. Cl.⁴ .............................................. H03F 3/16
[52] U.S. Cl. .................................. 330/277; 330/302; 330/311
[58] Field of Search .............. 330/277, 300, 302, 303, 330/304, 305, 306, 307, 310, 311

[56] References Cited
U.S. PATENT DOCUMENTS
4,390,851  6/1983  Higgins et al. ................ 330/311 X Primary Examiner—Steven Mottola
Attorney, Agent, or Firm—Joe E. Barbee

[57] ABSTRACT

A gallium arsenide monolithic microwave integrated circuit amplifier comprising a first stage having a common gate field effect transistor to provide matching of the input impedance, a second stage having a common source field effect transistor to provide class A gain, and a third stage having a common source open drain field effect transistor to provide class B gain for the amplifier. This monolithic integrated circuit amplifier provides a gain of greater than 25 decibels over a frequency band of 400 mHz–1.5 GHz.

4 Claims, 2 Drawing Sheets

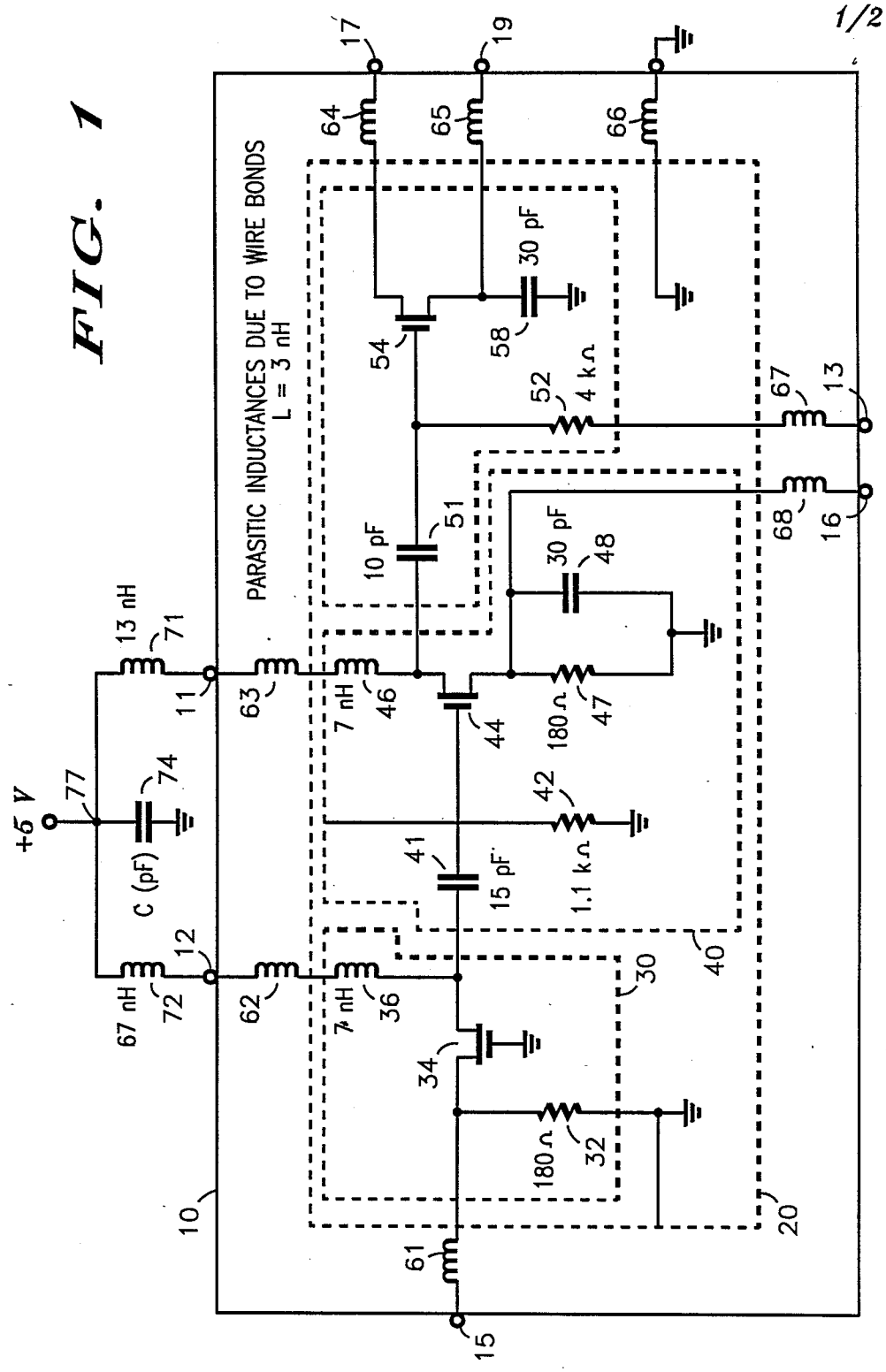

GALLIUM ARSENIDE POWER MONOLITHIC MICROWAVE INTEGRATED CIRCUIT

BACKGROUND OF THE INVENTION

This invention relates to radio frequency (RF) power modules and, in particular, to integrated circuit preamplifiers. Preamplifiers are a class of amplifiers commonly used in radio communication.

Portable, cellular radios have obtained wide spread use in modern society Unfortunately, these radios are often too large and too heavy for a user to carry around comfortably. A smaller radio would be highly advantageous.

Much of the bulkiness of present cellular radios is dedicated to power modules which amplify or receive signals or to the size of the battery required for those power modules. Designers have been unable to this point to design a monolithic microwave integrated circuit (MMIC) amplifier for radio frequencies between 100 MHz and 1.5 GHz. Instead, hybrid circuits requiring transmission lines and sometimes large bipolar junction transistors have been utilized. The aforementioned transmission lines take up a lot of space. These prior art hybrid circuits are also very expensive to manufacture.

A MMIC preamplifier should be comprised of gallium arsenide (GaAs), since GaAS devices, unlike silicon (Si) devices, have a natural insulating property which prevents loss of some of the RF signal. A Si MMIC would suffer some loss of the RF signal which would severely decrease operational efficiency of the radio. However, while GaAS MMIC preamplifiers are preferable, designers have been unable to achieve required amplification in them for RF applications. Only 8-12 GHz amplifiers are presently available. Devices which work in the 300 MHz-1.5 GHz range are required to be useful for many applications since currently 450 MHz and 900 MHz frequencies are the most commonly used frequencies in cellular radio communications.

SUMMARY OF THE INVENTION

It is an object of the present invention to provide a new and improved preamplifier for RF frequency applications which is smaller and less expensive than prior art devices.

It is an additional object of the present invention to provide a new and improved preamplifier for RF frequency applications which provides good input match, low component count and high gain in a compact package.

It is a further object of the present invention to provide a GaAS MMIC preamplifier which attains a gain of greater than 25 db at frequency ranges as low as 300 MHz to 1.5 GHz.

These and other objects and advantages of the present invention are achieved by a three stage monolithic integrated circuit wherein the first stage utilizes a common gate field effect transistor to provide a matched path for a received signal, the second stage comprises a common source field effect transistor to provide class A gain, and the third stage uses an open drain field effect transistor to provide a class B amplified output.

The objects and advantages described above will become apparent to those skilled in the art upon consideration of the accompanying specification and drawings.

DESCRIPTION OF THE PREFERRED EMBODIMENT

Figure 1:
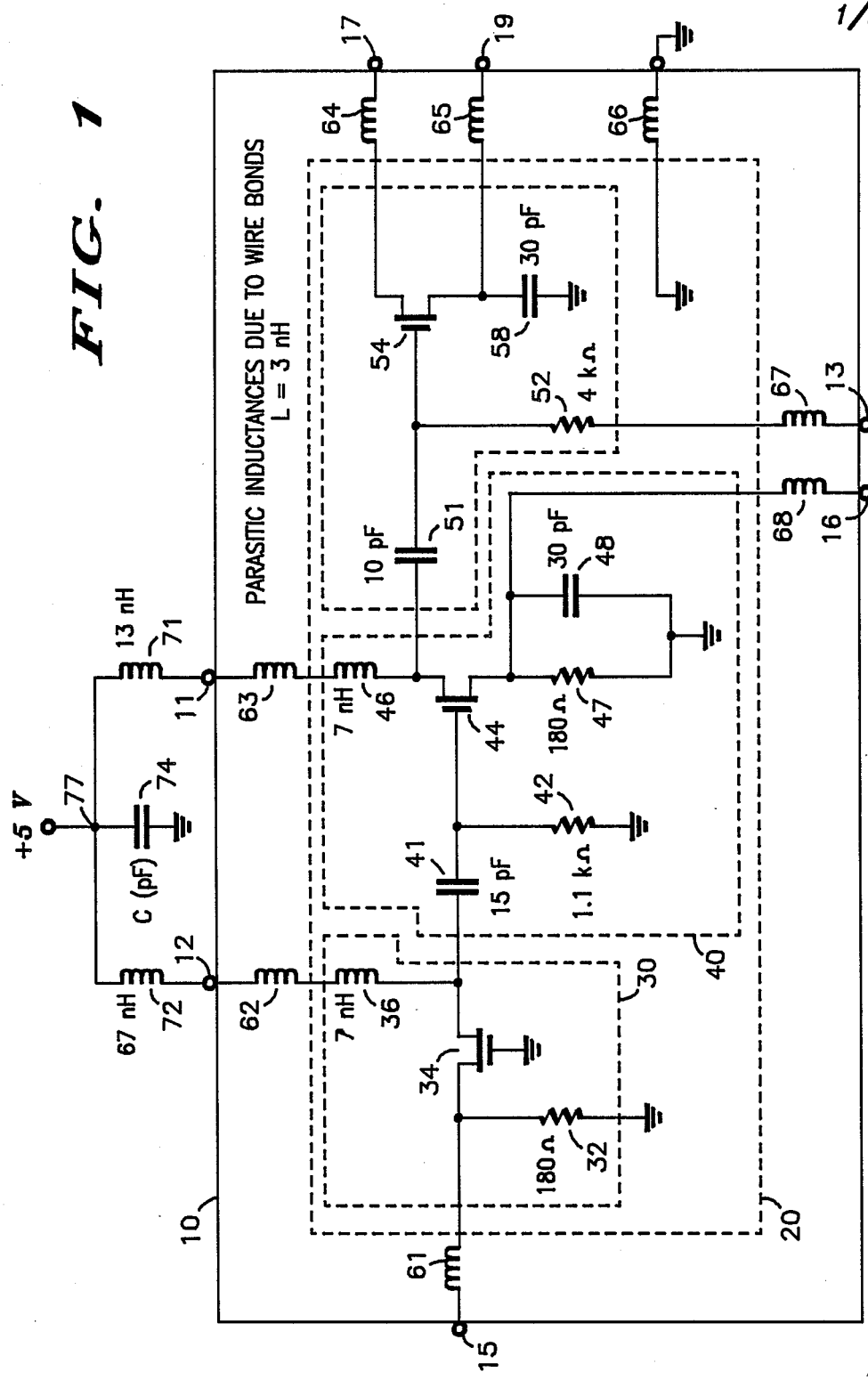
FIG. 1 represents an electrical circuit diagram of a GaAS power MMIC preamplifier chip and package embodying the present invention.

Referring specifically to FIG. 1, a semiconductor chip 20 is illustrated on semiconductor chip package 10. Semiconductor chip 20 contains a monolithic integrated circuit consisting of three stages. The three stages are: matching circuit 30, class A gain stage 40, and class B gain stage 50.

The main component of matching circuit 30 is a common gate N-channel field effect transistor (FET) 34. The source of FET 34 receives a signal from input pin 15. Also coupled to the source of FET 34 is a grounded resistor 32. The drain of FET 34 is coupled to an inductor 36. Inductor 36 forms a path to pin 12 on package 10. The drain of FET 34 is also coupled along an independent path to class A gain circuit 40.

The main component of class A gain circuit 40 is a N-channel FET 44. Coupled between the gate of FET 44 and the drain of FET 34 is a blocking capacitor 41. A grounded bias resistor 42 is coupled between the gate of FET 44 and blocking capacitor 41. The source of FET 44 is coupled to a parallel combination of resistor 47 and capacitor 48. Both resistor 47 and capacitor 48 are also connected to ground. Pin 16 on package 10 is also coupled to the parallel combination of resistor 47 and capacitor 48. An inductor 46 is coupled between the drain of FET 44 and pin 11. The drain of FET 44 is also coupled along the independent path to class B gain circuit 50.

The main component of class B gain circuit 50 is open drain FET 54. Coupled between the gate of FET 54 and the drain of FET 44 is a blocking capacitor 51. A bias resistor 52 having a first terminal coupled between the gate of FET 54 and blocking capacitor 51, and a second terminal coupled to pin 13 is also utilized in class B gain circuit 50. The source of FET 54 is coupled to both a grounded capacitor 58 and pin 19. The open drain of FET 54 is coupled to output pin 17.

While ignored to this point, it should be noted that inductors 61, 62, 63, 64, 65, 66, 67, 68 represent the parasitic inductances due to wire bonding between semiconductor chip package 10 and semiconductor chip 20. Furthermore, it should be noted that semiconductor chip 20 is most efficient when it is comprised of gallium arsenide and FETS 34, 44, and 54 are metal semiconductor field effect transistors (MESFETs).

The drain of FET 34 and the drain of FET 44 are coupled to a bias node 77 via inductor 72 and inductor 71, respectively. Bias node 77 is coupled to a grounded capacitor 74, and is also capable of receiving a bias voltage supply. It should be apparent to those skilled in the art that, while in FIG. 1, a common bias node and grounded capacitor are utilized, separate bias nodes and grounded capacitors could be used for FET 34 and FET 44.

The functioning of the circuit shown in FIG. 1 is described below:

A signal is received at input pin 15 on package 10, passes through inductor 61, and enters matching circuit 30. The reason that matching circuit 30 is called such is that when the gate of FET 34 is grounded, there is very little reflection of the input signal. This is true over a broad frequency range.

When bias node 77 is connected to a bias voltage supply (typically 5-7 volts), bias resistor 32 is used to set up a potential difference between the gate and the source of FET 34. This allows FET 34 to turn on. Typically, bias resistor 32 will be 180 ohms and the current flow through it will be 10 mA. An RF signal will also pass from the drain of FET 34 to class A gain circuit 40. Inductors 36, 62, and 72 operate as a choke to prevent loss of the RF signal from the drain of FET 34 to bias node 77.

The purpose of blocking capacitor 41 is to insure that none of the dc bias current is permitted to go from the drain of FET 34 to the gate of FET 44. The bias voltage supply connected to bias node 77 also is applied to FET 44. This creates a dc current flow through resistor 47. Bias resistor 42 helps create a bias which allows FET 44 to turn on. Capacitor 48 operates as an open circuit at dc, but is used to help set the AC load line. Since FET 44 is on, it operates to magnify the RF signal. The RF signal is then passed from the drain of FET 44 to class B gain circuit 50. Inductors 46, 63, and 71 operate as a choke to prevent loss of the RF signal emanating from the drain of FET 44. Bypass capacitor 74 is utilized to eliminate any RF signal that does get through to bias node 77, thus ensuring an RF ground at node 77.

Blocking capacitor 51 serves the identical purpose of blocking capacitor 41 by preventing any dc bias current from going from the drain of FET 44 to the gate of FET 54. Bias resistor 52 is used to bias the gate of FET 54 by applying a source to pin 13. Capacitor 58 is once again used to set the AC load line, and the RF output is passed through the open drain of FET 54 to output pin 17. The open drain of FET 54 allows for great flexibility since it can be connected to a number of other circuits. It is most common for the drain of FET 54 to be connected to a power FET and then an antenna.

The class B gain circuit 50 allows for an efficiency reading of approximately 80 percent compared to an approximate 47 percent efficiency rating of a class A gain circuit. Class B gain circuit 50 also allows idling at a low 0-10 mA. This means that when no RF signal is applied to input pin 15, the amplifier of chip 20 will draw minimal current, thus saving battery lifetime.

Figure 2:
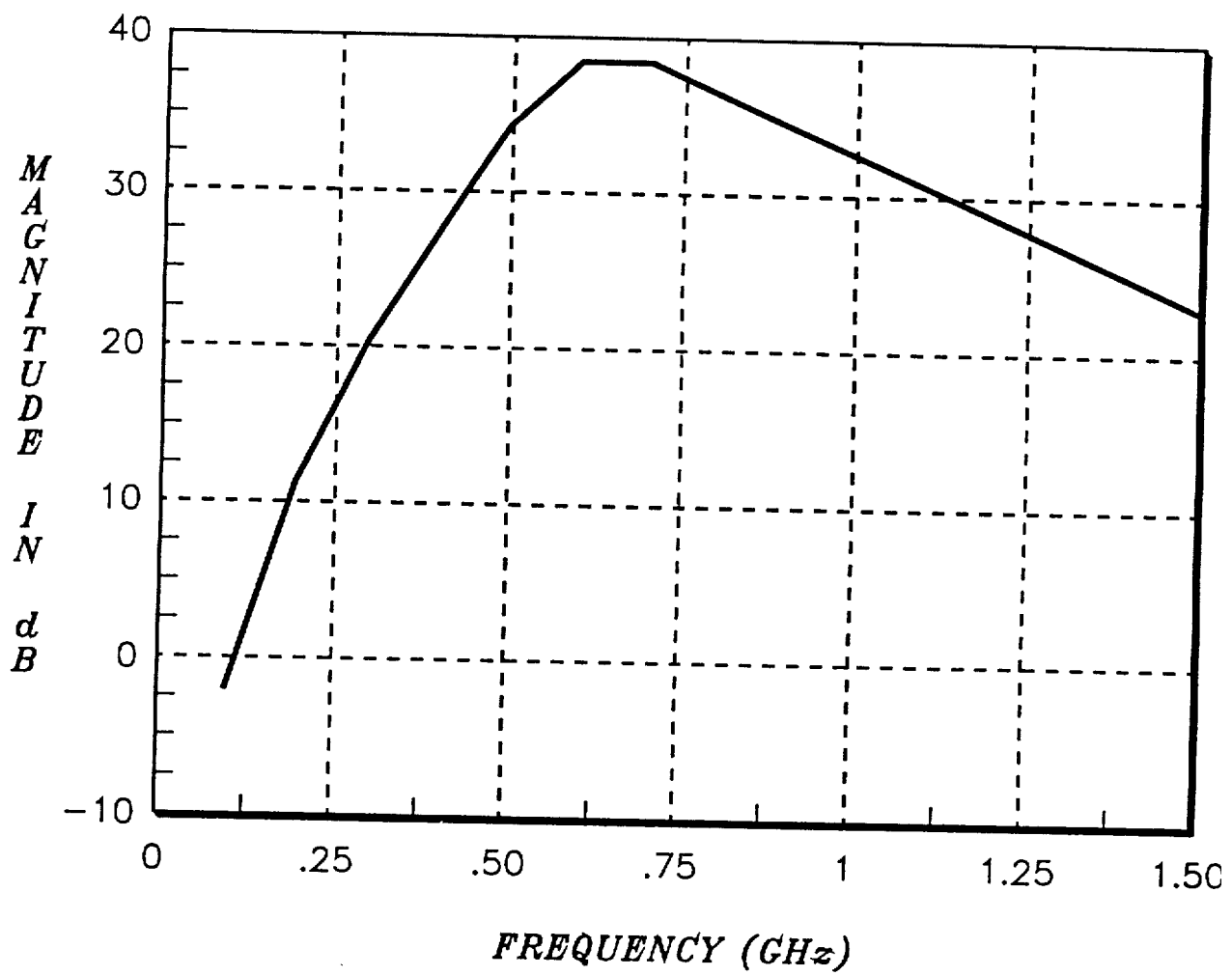
FIG. 2 is a graphical analysis of the magnitude of the gain (in decibels) over a frequency range of 0-1.5 GHz for the circuit represented in FIG. 1.

When components if FIG. 1 are given values as indicated, the gain from input Pin 15 to output Pin 17 is shown in FIG. 2 for frequencies between 0 and 1.5 GHz. The magnitude of the gain in decibels is higher than the desired 25 db at the commonly used frequencies of 450 MHz and 900 MHz.

While a specific embodiment of this invention has been shown and described, further modifications and improvements will occur to those skilled in the art. We desire to be understood, therefore, that this invention is not limited to the particular form shown and we intend to cover all modifications which do not depart from the spirit and scope of the invention.

We claim:

1. A gallium arsenide monolithic microwave integrated circuit preamplifier having an input, an output, and first, second, third, fourth and fifth bias nodes, said circuit comprising:

a first stage having a common gate field effect transistor, said first stage providing a matched path for a received signal;

a second stage coupled to said first stage having a common source field effect transistor, said second stage capable of receiving an RF signal from said first stage and providing class A gain of said signal; and a third stage coupled to said second stage having an open drain field effect transistor, said third stage capable of receiving a class A amplified signal from said second stage and providing class B gain of said class A amplified signal, wherein said first stage comprises:

a first field effect transistor having a gate, a source, and a drain, said gate of said first field effect transistor for coupling to a first source of supply voltage, and said source of said first field effect transistor coupled to said input;

a first resistor having a first terminal for coupling to said first source of supply voltage, and a second terminal coupled to said source of said first field effect transistor, and a first inductor having a first terminal coupled to said drain of said first field effect transistor, and a second terminal coupled to said first bias node.

2. A gallium arsenide monolithic microwave integrated circuit preamplifier as recited in claim 1 wherein said second stage comprises:

a second field effect transistor having a source, a gate, and a drain;

a first blocking capacitor having first and second terminals, said first terminal of said first blocking capacitor coupled to said drain of said first field effect transistor, and said second terminal of said first blocking capacitor coupled to said gate of said second field effect transistor;

a second resistor having first and second terminals, said first terminal of said second resistor for coupling to said first source of supply voltage, and said second terminal of said second resistor coupled to said gate of said second field effect transistor;

a second inductor having first and second terminals, said first terminal of said second inductor coupled to said drain of said second field effect transistor, and said second terminal of said second inductor coupled to said second bias node;

a third resistor having first and second terminals, said first terminal of said third resistor for coupling to said first source of supply voltage, and said second terminal of said third resistor coupled to said source of said second field effect transistor and said third bias node; and a second capacitor having a first terminal for coupling to said first source of supply voltage and a second terminal coupled to said second terminal of said third resistor.

3. A gallium arsenide monolithic microwave integrated circuit as recited in claim 2 wherein said third stage comprises:

a third field effect transistor having a source, a gate and a drain, said drain of said third field effect transistor coupled to said output, and said source of said third field effect transistor coupled to said fourth bias node;

a third capacitor having first and second terminals, said first terminal of said third capacitor coupled to said drain of said second field effect transistor, and said second terminal of said third blocking capacitor coupled to said gate of said third field effect transistor;

a fourth capacitor having first and second terminals, said first terminal of said fourth capacitor for coupling to said first source of supply voltage, and said second terminal of said fourth capacitor coupled to said source of said third field effect transistor; and a fourth resistor having first and second terminals, said first terminal of said fourth resistor coupled to said fifth bias node, and said second terminal of said fourth resistor coupled to the gate of said third field effect transistor.

4. A gallium arsenide monolithic microwave integrated circuit preamplifier as recited in claim 3 further comprising:

a third inductor having a first and second terminals, said first terminal of said third inductor coupled to said first bias node and said second terminal of said third inductor for coupling to a second source of supply voltage;

a fourth inductor for coupling between said second bias node and said second source of supply voltage; and a fifth capacitor for coupling between said first and second sources of supply voltage.

* * * * *

UNITED STATES PATENT AND TRADEMARK OFFICE
CERTIFICATE OF CORRECTION

PATENT NO. : 4,890,069

DATED : December 26, 1989

INVENTOR(S) : Joseph M. Duffalo, et al

Page 1 of 2

It is certified that error appears in the above-identified patent and that said Letters Patent is hereby corrected as shown below:

The drawing sheet 2 of 2, consisting of Fig. 1, should be deleted to be replaced with the drawing sheet, consisting of Fig. 2, as shown on the attached page.

Signed and Sealed this

Thirteenth Day of July, 1993

Attest:

MICHAEL K. KIRK

Attesting Officer

Acting Commissioner of Patents and Trademarks